(12) United States Patent
Cok

(10) Patent No.: US 7,687,989 B2
(45) Date of Patent: Mar. 30, 2010

(54) EMISSIVE DISPLAYS HAVING IMPROVED CONTRAST

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 599 days.

(21) Appl. No.: 11/565,883

(22) Filed: Dec. 1, 2006

(65) Prior Publication Data

US 2008/0129189 A1 Jun. 5, 2008

(51) Int. Cl.
*H01J 1/62* (2006.01)
(52) U.S. Cl. .................................. 313/506; 313/504
(58) Field of Classification Search ................ 313/498, 313/504, 506, 509, 512
See application file for complete search history.

(56) References Cited

U.S. PATENT DOCUMENTS 6,411,019 B1   6/2002   Hofstra et al.
2002/0050958 A1   5/2002   Mattheis et al.
2003/0128315 A1*  7/2003   Tashiro et al. ............... 349/113
2004/0191548 A1   9/2004   Takemoto
2006/0186802 A1   8/2006   Cok et al.

FOREIGN PATENT DOCUMENTS

WO   2002/10845   2/2002
WO   2005/092544   10/2005

* cited by examiner

*Primary Examiner*—Vip Patel
(74) *Attorney, Agent, or Firm*—Morgan Lewis & Bockius LLP

(57) ABSTRACT

An emissive display device, including: a reflective electrode and a transparent electrode. One or more light-emitting layers are formed between the reflective and transparent electrodes. A scattering layer is positioned in the emissive display device to scatter light trapped in the one or more light-emitting layers; and a circular polarizer is located on the side of the scattering layer opposite the reflective electrode.

13 Claims, 11 Drawing Sheets

EMISSIVE DISPLAYS HAVING IMPROVED CONTRAST

FIELD OF THE INVENTION

The present invention relates to emissive displays, and more particularly, to improving the contrast of displays having relatively high-index emissive layers.

BACKGROUND OF THE INVENTION

Flat-panel displays, such as organic light emitting diode (OLED) and inorganic emissive displays, of various sizes are proposed for use in many computing and communication applications. In particular, such displays are proposed for use in both indoor and outdoor applications under a wide variety of ambient lighting conditions. Indoor applications have relatively low ambient illumination and require lower levels of display luminance. In contrast, outdoor applications can have a high ambient luminance and may require higher levels of display luminance together with low display reflectance. Moreover, most emissive displays are proposed for use in conditions that can be high, or low, or even non-existent ambient illumination; for example, illumination from outdoor use during the day to night-time use in a dark room.

Current illumination and display visibility standards cite 75,000 lux as a standard for outdoor illumination on a bright and sunny day. Cloudy bright days have an illumination of 16,000 lux, cloudy dull days have an illuminance of 6,000 lux, and a cloudy very dull day has an illuminance of 1,000 lux. Indoor illumination ranges from 0 to 1000 lux. Viewability standards for display devices set the minimum display contrast ratio standard for reading text on a display at three. Other sorts of displayed information, such as images, require a higher contrast ratio, for example, ten.

Given the wide variety of viewing conditions proposed for emissive displays, it is difficult to design a display having suitable contrast ratio. For example, OLED displays rely on the use of conductive electrodes, typically some form of highly reflective metal, to provide current to an emissive layer of organic material. The reflective metals reflect ambient light towards a display viewer, thereby, making the display difficult to view.

An OLED display device includes both light-emitting areas and non-light emitting areas. In an active-matrix display, the non-light emitting areas are typically composed of circuitry such as thin-film transistors, capacitors, drivers, and signal lines. In a passive-matrix display, the non-light-emitting areas are typically composed of signal lines.

One way of improving contrast in emissive display devices is to use a circular polarizer over the display. The circular polarizer includes a polarizer and a quarter-wave plate. The polarizer polarizes ambient light falling on the display, and the quarter wave plate circularly polarizes the linearly polarized light by 45 degrees. Any polarized light that is subsequently reflected back through the quarter wave plate is further rotated by 45 degrees so that its direction of polarization is orthogonal to the polarizer, and hence is substantially completely absorbed by the polarizer. Circular polarizers absorb approximately 50%-60% of the light that passes through the polarizer once. Up to 99% of the ambient light that is specularly reflected back through the circular polarizer may be absorbed. Hence, about 50%-60% of the light emitted by the emissive display device through the circular polarizer is lost, while up to 99% of the ambient light that falls on the surface of the display device is absorbed. Suitable circular polarizers are commercially available, for example, from 3M and are described in the patent literature. See, for example, WO/0210845, entitled "High Durability Circular Polarizer for Use with Emissive Displays", by Trapani et al., published Feb. 7, 2002, which describes a high durability circular polarizer including an unprotected K-type polarizer and a quarter-wavelength retarder that is designed for use with an emissive display module such as an organic light emitting diode or a plasma display device. However, in darker, indoor surroundings it may be advantageous to have improved luminance rather than reduced display reflectance.

A second means of improving contrast in an emissive display device is to place an absorptive layer such as a light absorbing material or a destructive interference layer within a cavity at the back of the device, for example, on the substrate or an electrode. See for example U.S. Pat. No. 6,411,019, entitled "Organic Electroluminescent Device" issued Jun. 25, 2002 to Hofstra et al. The absorptive layer absorbs the ambient light in addition to any light emitted from the emissive layer of organic materials. However, this approach has the difficulty that most of the light emitted from the emissive layer toward the absorptive layer is lost, thereby, severely reducing the luminance of the display.

A third means of improving contrast in an emissive display device is to provide a matrix of light absorbing material called a black matrix between the light emitting elements and around the edges of the display device. See for example, US Patent Application 2002/0050958, entitled "Contrast Enhancement for an Electronic Display Device by Using a Black Matrix and Lens Array on Outer Surface of Display", by Matthies, et al., published May 2, 2002. This black matrix approach is capable of significantly reducing the reflectance of the display, but still allows substantial ambient light to be reflected from the display by reflection from the reflective anodes of the light emitting elements. Neutral density filters are also known to improve the contrast of a display device.

The use of louver films comprising alternating light-transmissive and light-absorbing portions as privacy-securing films for display devices has been suggested, e.g., as described in US Patent 2004/0191548, entitled "Sheets for Plasma Display Panels", by Takemoto, published 30 Sep. 2004, and in WO 2005/092544, entitled "Privacy Securing Film", by Hwang, published 6 Oct. 2005. Such louver films are typically employed on the top surface of a display device, and while effective at reducing viewing angles, typically have not been suggested for use in displays to improve light output and ambient contrast.

Applicants have determined through experimentation that the image quality of the display device as perceived by a viewer depends not only on the ambient contrast, but also on the luminance of the display; hence there is a need for an emissive display that simultaneously improves both ambient contrast and luminance.

SUMMARY OF THE INVENTION

The need is met by providing an emissive display device that includes a reflective electrode and a transparent electrode. One or more light-emitting layers are formed between the reflective and transparent electrodes. A scattering layer is positioned in the emissive display device to scatter light trapped in the one or more light-emitting layers; and a circular polarizer is located on the side of the scattering layer opposite the reflective electrode.

ADVANTAGES

The present invention has the advantage that it increases both the luminance and ambient contrast of an emissive display device.

It will be understood that the figures are not to scale since the individual layers are too thin and the thickness differences of various layers too great to permit depiction to scale.

DETAILED DESCRIPTION OF THE INVENTION

Figure 1:
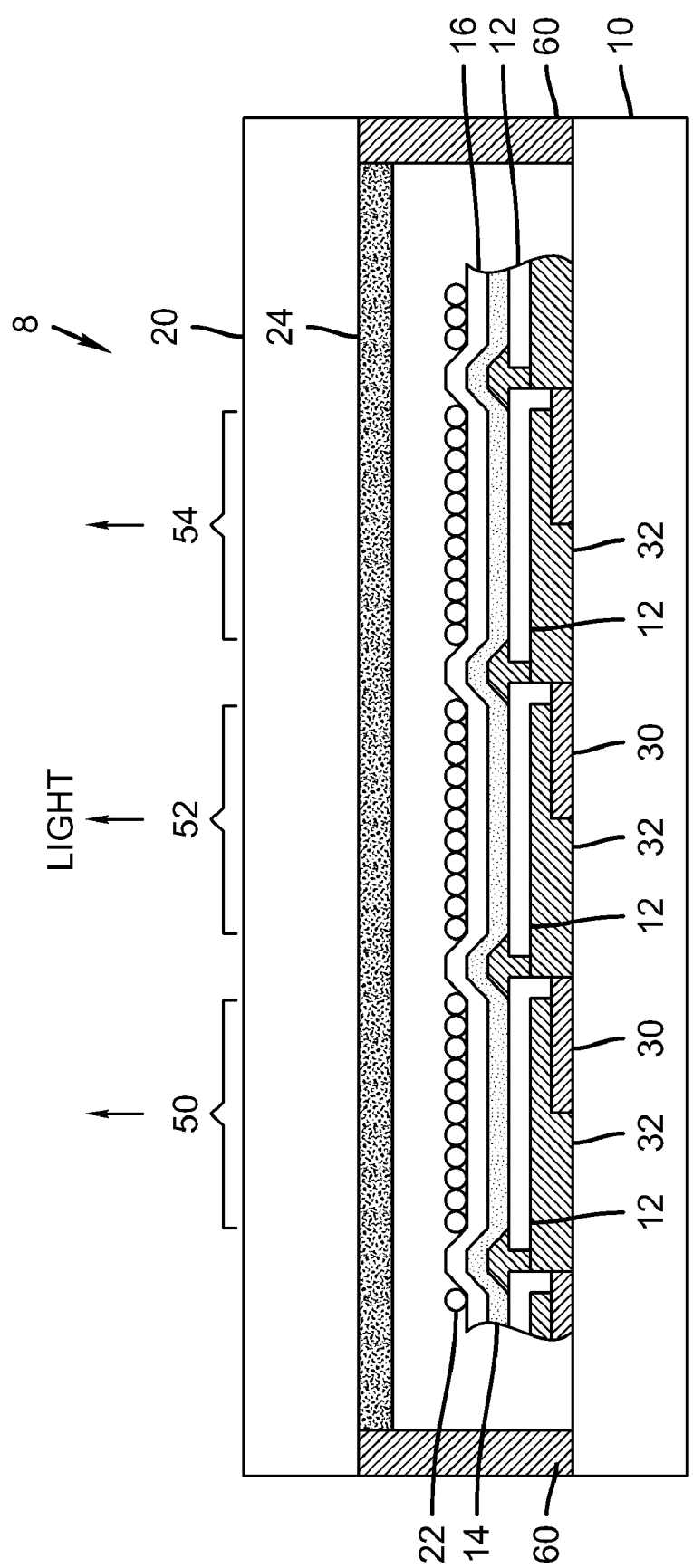
FIG. 1 is a cross sectional schematic diagram of an OLED device according to an embodiment of the present invention.

Referring to FIG. 1, an emissive display device 8 according to the present invention comprises a substrate 10; a reflective electrode 12 formed over the substrate 10; one or more light-emitting layers 14 formed over the substrate 10; a transparent electrode 16 formed over the one or more light-emitting layers 14, the reflective and transparent electrodes 12, 16 and one or more light-emitting layers 14 form a light-emitting element for emitting light in a direction of light emission, as defined by the pattern of the reflective electrode 12; a scattering layer 22 to scatter light trapped in the one or more light-emitting layers 14, a circular polarizer 24 located in the direction of light emission. Typically, in a display device, at least one of the reflective or transparent electrodes 12, 16 is patterned to define the light-emitting areas of the display. Thin-film electronic components 30 may be employed to provide current to the electrodes 12, 16 in response to signals. Such signals and thin-film electronic components, for example, low-temperature or amorphous silicon, are well known in the art, as are means for forming electrode and light-emissive organic or inorganic material layers. Planarizing layers 32 may be employed to form smoothing and insulating layers, which are also well known in the display manufacturing art.

Figure 2:
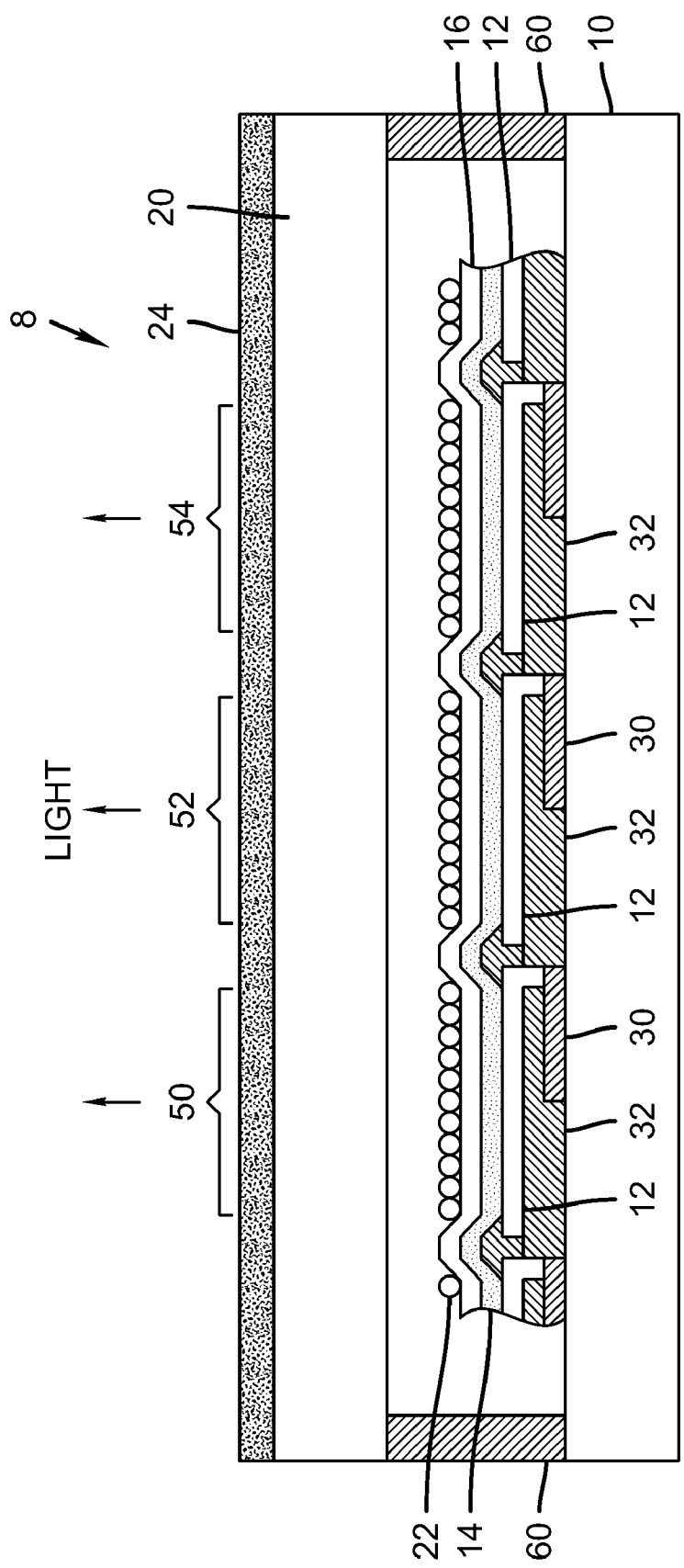
FIG. 2 is a cross sectional schematic diagram of an OLED device according to an alternative embodiment of the present invention.
Figure 3:
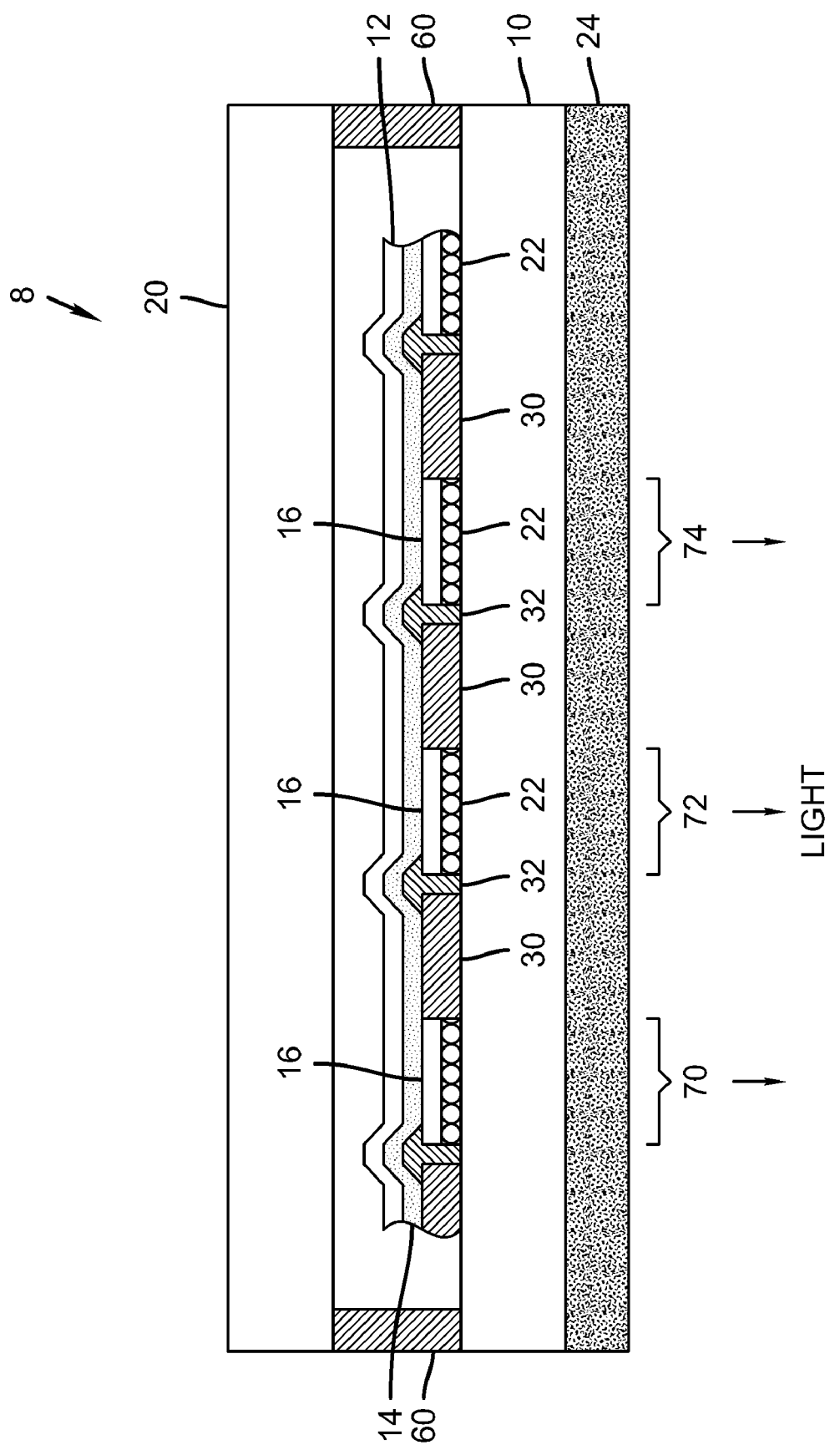
FIG. 3 is a cross sectional schematic diagram of an OLED device according to another embodiment of the present invention.
Figure 6:
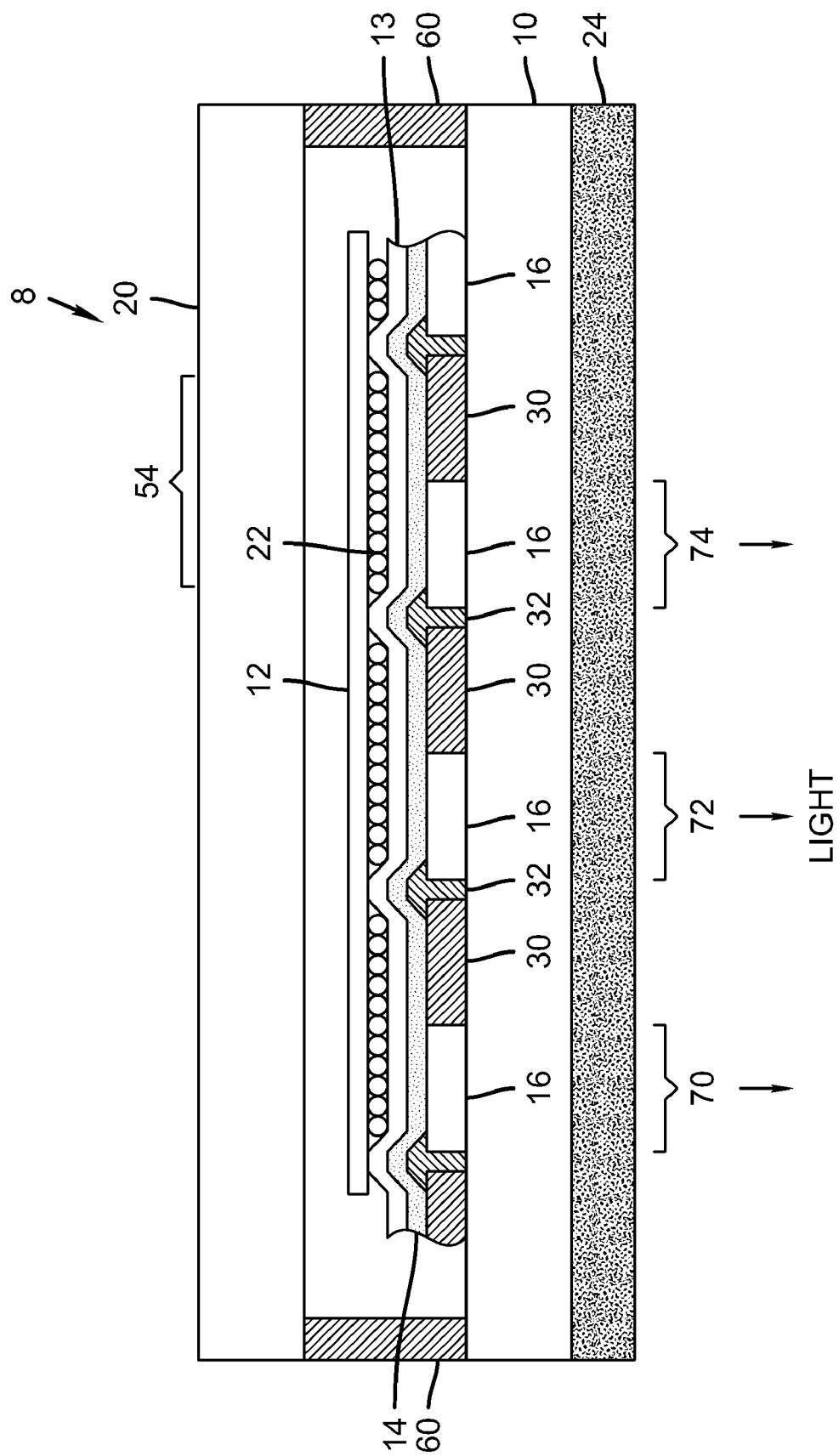
FIG. 6 is a cross sectional schematic diagram of an OLED device employing a bi-layer electrode according to another embodiment of the present invention.

In one or more embodiments of the present invention (FIGS. 1 and 2), the reflective electrode 12 may be located adjacent to the substrate 10 and the transparent electrode 16 may be located on the other side of the light-emitting layer 14 to form a top-emitter device that emits light through the cover 20. In other embodiments of the present invention (shown in FIGS. 3 and 6), the location of the reflective electrode 12 and the location of the transparent electrode 16 are exchanged to form a bottom-emitting device that emits light through the substrate. In the embodiments of FIGS. 1 and 2, the reflective electrode 12 is patterned to form light-emitting elements that emit light in light-emitting areas 50, 52, 54. In the embodiment of FIGS. 3 and 6, the transparent electrode 16 is patterned to form similar, but smaller light-emitting areas 70, 72, 74 separated by planarizing layers 32 and thin-film electronic elements 30.

The scattering layer 22 scatters light trapped in the one or more light emitting layers. In an embodiment, light emitted by the light-emitting layer 14 does not pass through a layer having a lower optical index than the light-emitting layer 14 before the light is scattered by the scattering layer 22. Hence, light that would otherwise be trapped in the light-emitting layer 14 and transparent electrode 16 may be scattered out of the device 8 by the scattering layer 22, thereby increasing the light output of the device 8.

Figure 4:
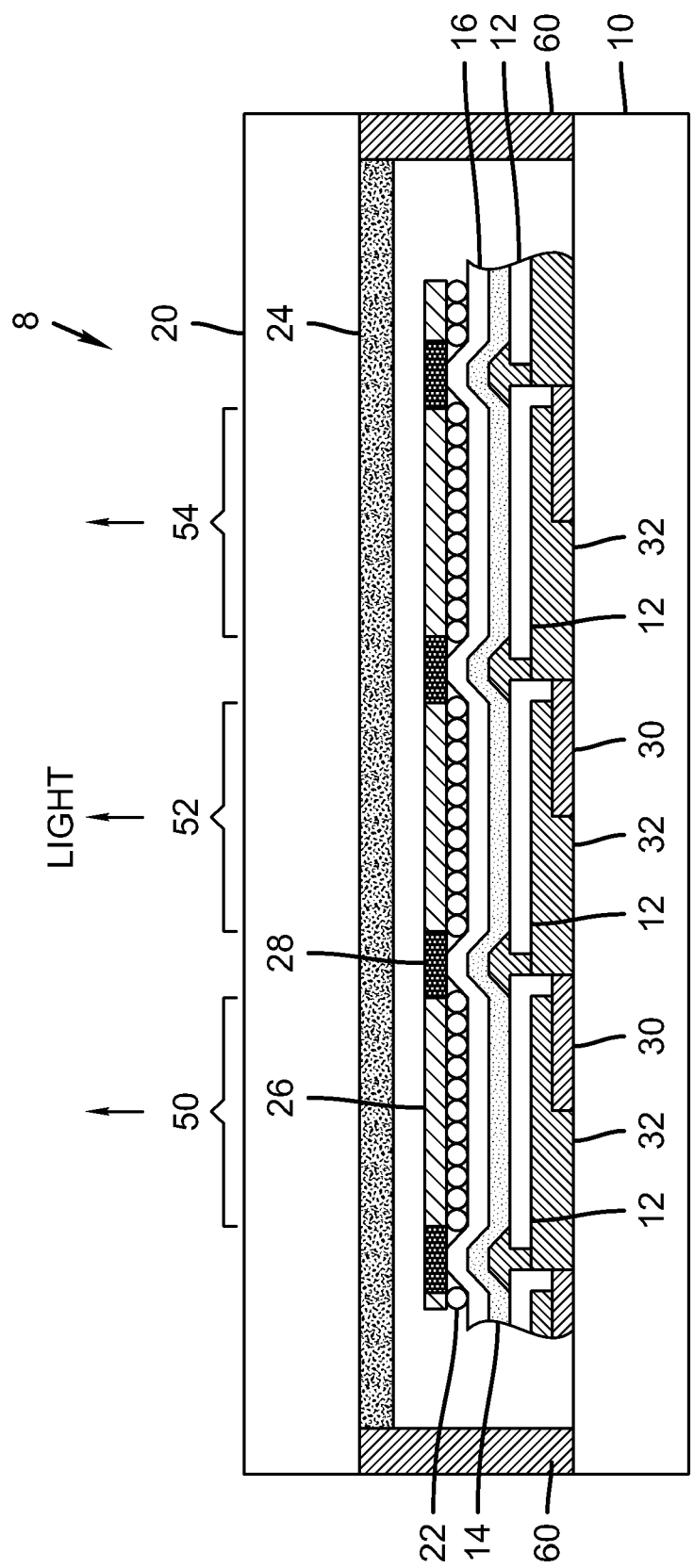
FIG. 4 is a cross sectional schematic diagram of an OLED device according to yet another embodiment of the present invention.

The different light-emissive elements of the present invention may emit different colors of light, for example, red, green, and blue, by employing different materials pattern-deposited over the reflective electrodes 12 to form a full-color display. Referring to FIG. 4, in an alternative top-emitter embodiment of the present invention, an unpatterned broadband or white-light emitter may be employed in the light-emitting layer 14. Color filters 26 are employed to provide colored light and a black matrix 28 is provided between the light-emitting areas to absorb ambient light to improve the ambient contrast ratio of the device 8. Suitable color filters and black matrix materials are known in the art.

Figure 5:
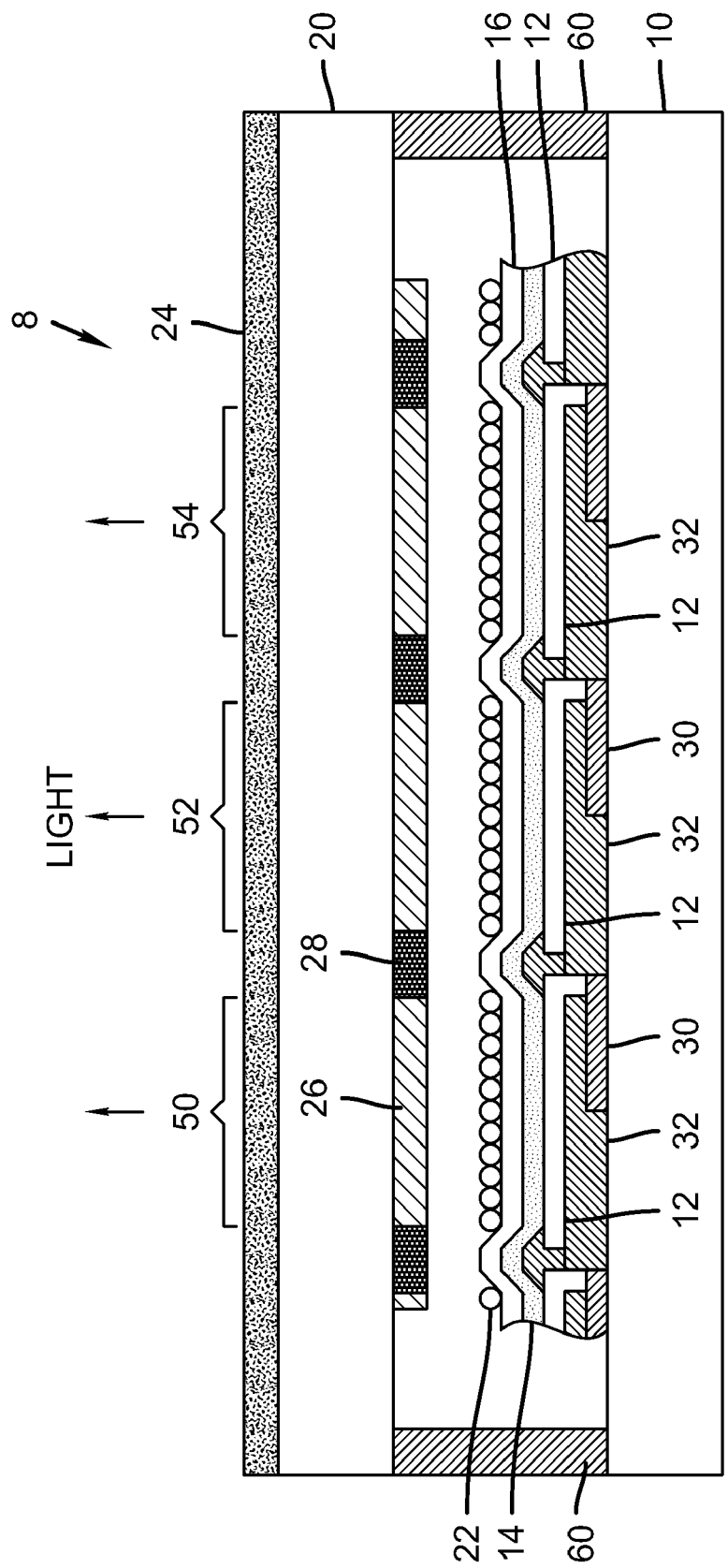
FIG. 5 is a cross sectional schematic diagram of an OLED device employing color filters according to an embodiment of the present invention.

As shown in FIGS. 1-6, a cover 20 is affixed to the substrate 10 by an adhesive 60 to encapsulate the device. As shown in FIGS. 1 and 4, the circular polarizer 24 may be located on the inside of the cover 20 between the cover 20 and the light-emitting layer 14, for example, in a top-emitting display. In alternative embodiments of the present invention as illustrated in FIGS. 2 and 5, the circular polarizer 24 may be located on the side of the cover 20 opposite the light-emitting layer 14. In yet other alternative embodiments (shown in FIGS. 3 and 6), the circular polarizer 24 may be located on the substrate 10 so that the substrate 10 is located between the circular polarizer 24 and the light-emitting layer 14, thus forming a bottom-emitting display.

The scattering layer 22 may also be located in various positions relative to the light-emitting layer 14 and the circular polarizer 24. As shown in FIG. 1, the scattering layer 22 may be located between the light-emitting layer 14 and the circular polarizer 24. Alternatively, as shown in the embodiment of FIG. 6, the light-emitting layer 14 may be located between the scattering layer 22 and the circular polarizer 24, for example by locating the scattering layer 22 between an additional transparent electrode layer 13 in electrical contact with a reflective electrode 12.

Figure 11:
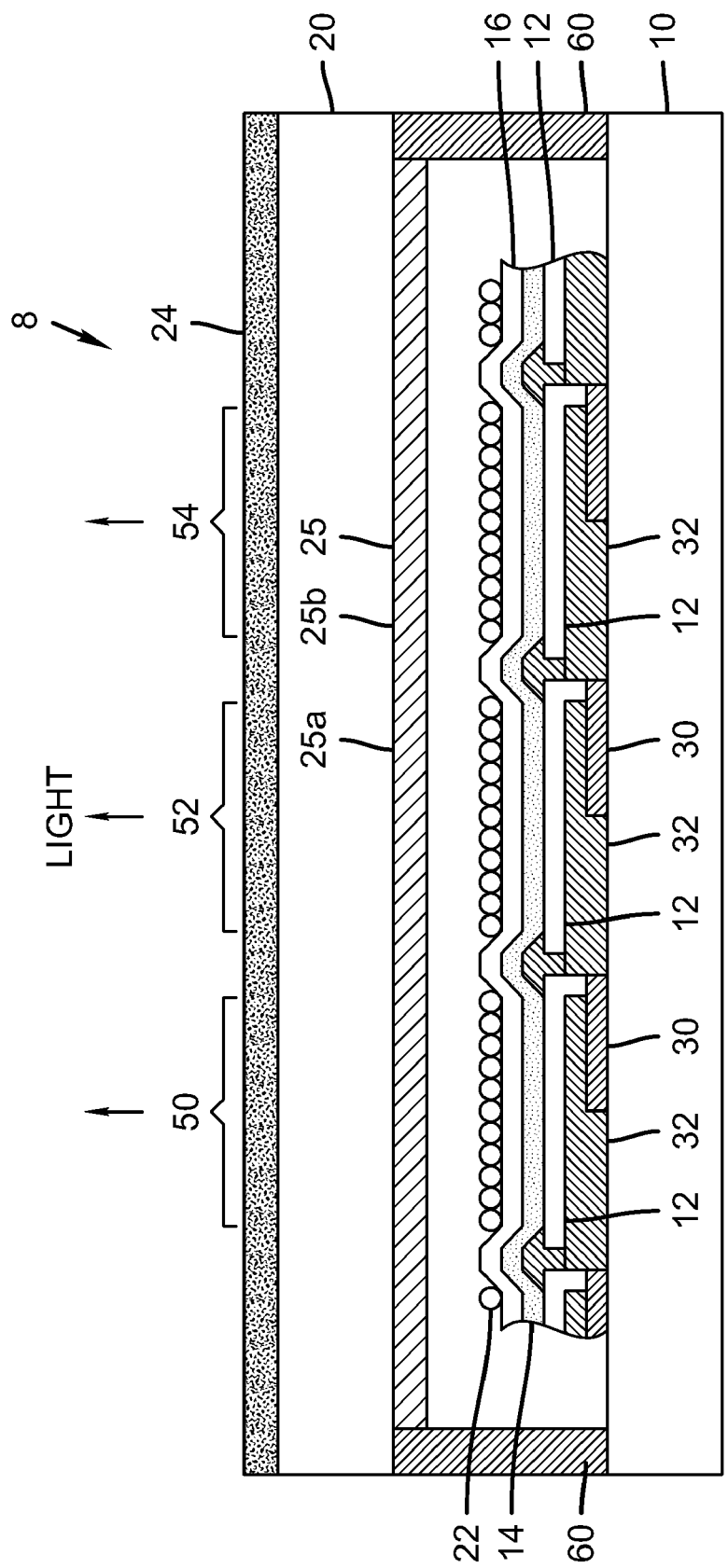
FIG. 11 is a cross sectional schematic diagram of an OLED device employing a contrast-enhancement layer according to another embodiment of the present invention.

In a further embodiment of the present invention, shown in FIG. 11, a contrast-enhancement layer 25 includes a plurality of alternating light-absorbing portions 25a and light-transmissive portions 25b that are located on the side of the scattering layer 22, opposite the reflective electrode 12. A plurality of light-absorbing portions 25a and light-transmissive portions 25b are located in each light-emitting area defined by the patterned reflective electrode 12. The contrast-enhancement element 25 may be positioned in various locations in various embodiments of the present invention. In the top-emitter embodiment of FIG. 11, the contrast-enhancement layer 25 is formed in a film positioned adjacent to the cover 20, opposite the scattering layer 22; and the circular polarizer 24 is located on the outside surface of the cover 20.

The contrast enhancement layer 25 may be a self-supporting film manufactured separately and may employ, for example, micro-louver technology as described in US Patent 2004/0191548 and in WO 2005/092544; the disclosures of which are incorporated herein by reference. If a film is employed, the light-transmissive portions 25b may be formed of, for example, polymer. In order to enhance the light transmissivity of the light-transmissive portions 25a, the film is preferably thin, for example, less than 1 mm, more preferably less than 0.5 mm.

In alternative embodiments (not shown herein), the contrast-enhancement layer 25 may be formed directly on the inside of cover 20, for example, by employing photolithography for forming light-absorbing portions 25a of carbon black-impregnated resins and light-transmissive portions 25b. In yet another alternative embodiment, the light-absorbing portions 25a of contrast-enhancement layer 25 may be formed on the transparent electrode 16. The light-absorbing portions 25a may be pattern-deposited using existing technologies, for example, curable polymer materials including carbon black using inkjet or gravure processes. In this embodiment, the organic layer(s) 14 and scattering layer 22 are deposited between the light-absorbing portions 25a. The light-absorbing portions 25a extend above the scattering layer 22 to form the light-transmissive portions 25b of the contrast-enhancement layer 25. In this embodiment, it is possible that the organic layer(s) 14 and scattering layer 22 materials may also be deposited over, rather than only between, the light-absorbing portions 25a. Such deposition would not have any significant detrimental effect on the performance of the OLED device. In yet another alternative embodiment, the light-absorbing portions 25a and light-transmissive portions 25b of the contrast-enhancement layer 25 may be formed on protective layers formed on the transparent electrode 16. In a bottom-emitting embodiment, the contrast-enhancement layer 25 may be formed directly on the substrate 10 (or layers deposited on the substrate) using, for example, photolithographic processes with low-index transparent materials and light-absorbing resins. Such patternable resins are commercially available.

The light-absorbing portions 25a of the contrast-enhancement element 25 may be formed in any arrangement over the light-emissive areas 50, 52, and 54. For example, the light-absorbing portions 25a may be formed in lines in any desired direction or they may form a grid pattern as illustrated.

Ambient light incident on the OLED device 8 at a relatively high angle to the normal may encounter the light-absorbing portions 25a of the contrast-enhancement layer 25 and be absorbed, thereby improving the contrast of the OLED device 8. Ambient light approximately normally incident on the OLED device may encounter the light-transmissive portions 25b of the contrast-enhancement layer 25 and is scattered (as is the emitted light). Portions of this scattered light will be emitted light and another portion is absorbed by the contrast enhancement layer 25. Hence, the contrast enhancement layer 25 will not affect normal-angled emitted light; thereby the luminance of the emitted light is maintained. Light emitted at a large angle to the normal angle will be absorbed. Hence, the contrast enhancement layer 25 may initially absorb incident ambient light. The ambient light that is not absorbed by the contrast enhancement layer 25 will be scattered so that a significant portion is absorbed and only a relatively small amount of light is reflected back out of the OLED device 8, thereby decreasing the reflectance and improving the ambient contrast ratio of the OLED device 8.

The amount of emitted light that escapes from the OLED device 8 will depend on the width and height of the light-absorbing portions 25a, as well as the relative spacing between light-absorbing portion 25a and light-transmissive portion 25b. Likewise, the amount of absorbed ambient light will also depend on such factors. In general, it is preferred to make the light-absorbing portion 25a as thin as possible in the horizontal direction such that the height of the light-absorbing portions in a vertical dimension orthogonal to the substrate is greater than the minimum width of the light-absorbing portions in a horizontal dimension parallel to the substrate. Likewise, minimum reflection of ambient light is found when the height of the light-absorbing portions 25a is large relative to the spacing between the light-transmissive portions 25b, such that the height of the light-absorbing portions 25a in a vertical dimension orthogonal to the substrate 10 is greater than the minimum width of the light-transmissive portions 25b in a horizontal dimension parallel to the substrate 10.

The use of a contrast enhancement layer 25 in an OLED device with a scattering layer is described in more detail in commonly assigned U.S. patent application Ser. No. 11/297,196, by Cok entitled "OLED Device having Improved Output and Contrast" and is hereby incorporated by reference in its entirety.

In various embodiments of the present invention, the light-emitting layer 14 comprises inorganic phosphorescent or fluorescent materials. For example, the inorganic materials may be quantum dots. In other embodiments of the present invention, the light-emitting layer may comprise organic materials, for example in an OLED device. These materials and their deposition are known in the prior art.

In a further embodiment of the present invention, either the reflective or transparent electrodes 12, 16 are patterned to form distinct light-emitting areas and the scattering layer 22 is formed only over these patterned light-emitting areas 50, 52, 54, as shown in FIG. 1.

In general, circular polarizers work well when employed with devices having highly reflective surfaces. Conventional emissive devices employ light-emitting layers between a transparent electrode and a reflective electrode and the reflective electrode serves as the highly reflective surface. Such highly reflective surfaces serve to maintain the polarization of ambient light passing through the circular polarizer the first time, thereby enabling the destructive interference of the ambient light when reflected back through the circular polarizer. However, such polarizers typically absorb more than 50% of the light emitted from the device, as the light passes through the linear polarizer component of the circular polarizer. Hence, in dark conditions in which there is little ambient light, such a structure may be disadvantaged as compared to a device with no polarizer at all.

According to measurements performed by the Applicant, a commercially available circular polarizer may absorb about 98.4% of the ambient light falling on the display, and about 56% of the light emitted by the display is absorbed by the circular polarizer. An ambient contrast ratio of about 5 can be expected from such a display driven at 100 candelas per square meter emission and assuming a 50% fill factor and 100% reflectivity from all areas of the display operating under cloudy conditions. The fill factor is defined as the percentage of the area of the display that is light emissive (i.e. for a 50% fill factor, half of the area of the display is taken up by the transparent electrode 16 (i.e. the light emitting portions of the device). The ambient contrast ratio is calculated as the ratio of the reflected ambient light plus emitted light to the reflected ambient light.

The remaining area of the display that is not light-emissive may be covered with a black matrix to absorb ambient light. A prior-art display device (not shown) has a black matrix to enhance the ambient contrast of the display device includes a light-absorbing layer over the non-light emissive area of the device. The black matrix covers any non-light emissive areas between pixels and can also extend around the perimeter of the display device. The black matrix absorbs about 97 percent of the incident light falling on the matrix, however, about 97% of the ambient light falling on the light-emissive elements is reflected. A typical ambient contrast ratio of about 1.1 can be expected to be achieved by such a display with 100 candelas per square meter emission and a 50% fill factor under cloudy conditions. A suitable light absorbing material for the black matrix may be selected from the group comprising dyes and pigments. Pigments can include, for example, carbon black, graphite, metal oxides, metal sulfides, and metal complexes such as phthalocyanines. Black resin materials, black chrome, and antireflection layers may also be used to provide the black matrix. Such materials are known in the prior art. In a further embodiment of the present invention, the light absorber may have desiccating properties, thereby improving the lifetime of the organic layers.

Light emitted by some emissive devices, such as those employing relatively high-index organic or inorganic light-emissive layers in combination with an electrode comprising a transparent conductive electrode may be trapped in the light-emissive and transparent conductive layers due to total internal reflection at the interface between the relatively high-index light-emissive layer and the substrate or cover through which light is emitted. By relatively high index is meant that the optical index of the light-emissive layer is higher than that of the substrate (for a bottom-emitter device) or of the cover (for a top-emitter device). One solution to this problem is to employ light-scattering layers to scatter trapped light out of the device, for example as taught in US 2006/0186802 entitled "OLED Device having Improved Light Output" by Cok et al, published 24 Aug. 2006, which is hereby incorporated by reference in its entirety, and which describes the use of scattering layers formed over the transparent electrode of a top-emitter OLED device. It also teaches the use of very thin layers of transparent encapsulating materials deposited on the electrode to protect the electrode from the scattering layer deposition. Preferably, the layers of transparent encapsulating material have a refractive index comparable to the refractive index range of the transparent electrode and organic layers, or is very thin (e.g., less than about 0.2 micron) so that wave guided light in the transparent electrode and organic layers will pass through the layers of transparent encapsulating material and be scattered by the scattering layer. However, such a scattering layer, as described in the prior art, will destroy the polarization of the ambient light, thereby rendering the destructive optical interference of the circular polarizer inoperable. In this case, the linear polarizer will absorb approximately half of the incident ambient light in the first pass through the polarizer. The polarized incident ambient light will then strike the scattering layer and eventually (unless it is absorbed within the device) be scattered back through the polarizer, which will absorb approximately one half of the remaining light. Likewise, one half of the emitted light will, similarly, be absorbed. Hence, as taught in the prior art, the circular polarizer will only be as effective as a neutral density filter in improving the contrast ratio of the device. A neutral density filter will similarly absorb emitted light as it passes out of the device, but will absorb incident ambient light a first time as it passes into the device and then again a second time as it is reflected back out of the device.

Through experimentation, applicants have surprisingly discovered that a circular polarizer may be employed with a scattering layer in an emissive device having a relatively high-index emissive layer and a relatively low-index substrate (for a bottom-emitter) or cover (for a top-emitter). The scattering layer is effective in increasing the light emitted while the circular polarizer, despite some disruption of the polarization is still effective.

Applicants have demonstrated that the use of a scattering layer in an emissive device having a relatively high-index emissive layer can increase the light output from the device by 1.5-2.0 times. In other embodiments, a white-light-emitting emissive layer may be employed together with color filters. Such an arrangement will decrease the efficiency of the output by approximately a factor of three, due to absorption. Alternatively, four-element pixels using a white emitter in combination with filters for the red, green, and blue elements may be employed to approximately double the efficiency of the comparable RGB device, as taught in co-pending, commonly assigned U.S. application Ser. No. 10/897,953, by Miller et al., filed 13 Mar. 2003, which is hereby incorporated by reference in its entirety.

Table 1 below illustrates the relative percent reflectivity from an embodiment of the present invention compared to prior-art designs. The measurements were made with an OLED device employing a cover having an anti-reflective coating under standard VESA ambient illumination specifications. The circular polarizer was a commercially available circular polarizer that absorbed approximately 56% of the light passing through the circular polarizer in one pass. The color filter embodiments are estimates whose values may change depending on the thickness and spectrum of the color filters. The values given for the color filters are simplified approximations and presume equally sized light-emitting elements of each color. In the device of Table 1, it is presumed that the entire surface area is emissive and equally reflective (Device 1).

TABLE 1

Percent Reflection of Ambient Light under VESA Specification Illumination

| Structure | Without Scattering Layer | With Scattering Layer | RGB with color filter | RGBW with color filter |
| --- | --- | --- | --- | --- |
| Nothing | 100% | 100% | 33% | 50% |
| AR glass | 99.4% | 105% | 33% | 50% |
| Circular Polarizer | 1.6% | 14% | 0.5% | 0.8% |
| 50% Neutral Density Filter | 25% | 25% | 8% | 12.5% |
| Contrast Enhancement Layer | 11.9% | 3.2% | 4% | 6% |

As can be seen from Table 1, the circular polarizer is effective at reducing reflection from the device. The scattering layer reduces the effectiveness of the anti-reflective layer. Surprisingly, however, the circular polarizer is still effective in reducing reflection by a significant amount even in the presence of the scattering layer. When combined with the increase in reflection due to the anti-reflective glass (attributed to disruption of the destructive optical interference by the scattering layer), the circular polarizer absorbs 86% of the ambient light. Moreover, the specular reflection is greatly reduced. The neutral density filter is less effective at absorbing light, absorbing up to 75% of the ambient light. The presence of color filters also significantly reduces the reflection, as does the use of the contrast enhancement layer, particularly when employed with the scattering layer. Front-surface reflections are ignored in this analysis.

Table 2 gives the relative luminance of the various filter structures. In particular, the presence of the scattering layer increases the light output, as does the use of an RGBW structure in a CFA embodiment.

TABLE 2

Relative Luminance of Emissive Device

| Filter Structure | Without Scattering Layer | With Scattering Layer | RGB with color filters | RGBW with color filters | RGBW with color filters and SL |
|---|---|---|---|---|---|
| Nothing | 100% | 200% | 33% | 66% | 133% |
| Circular Polarizer | 44% | 88% | 15% | 30% | 60% |
| 50% Neutral Density Filter | 50% | 100% | 17% | 34% | 68% |
| Contrast Enhancement Layer | 100% (normal) | 200% (normal) | 33% (normal) | 66% (normal) | 133% (normal) |

Figure 7:
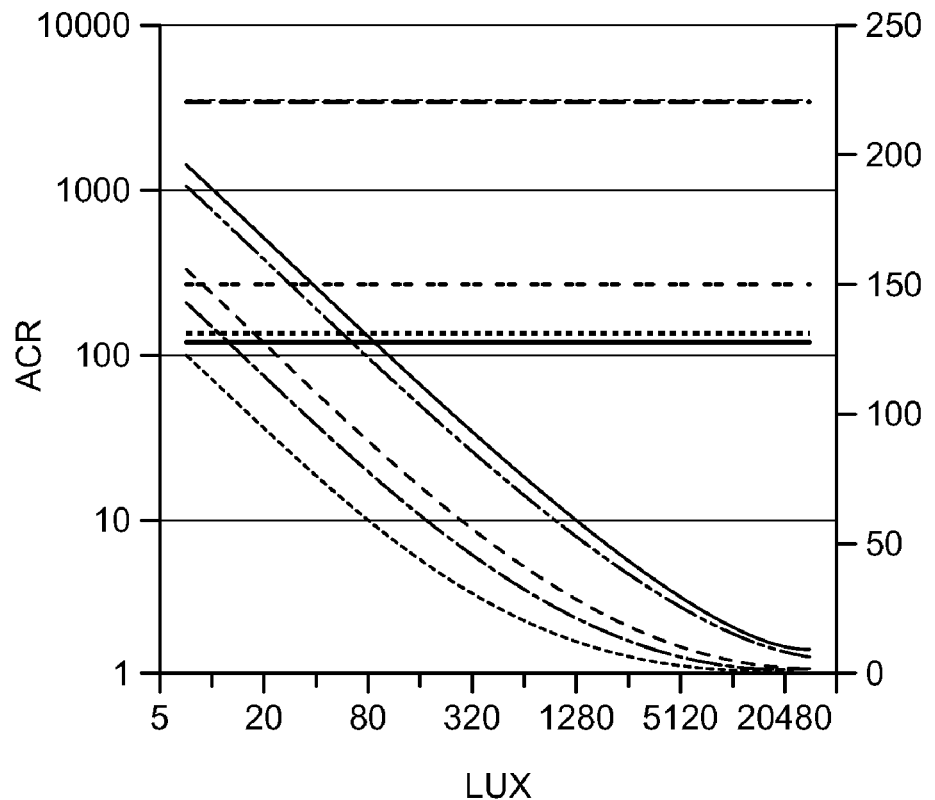
FIG. 7 is a graph illustrating the performance of an embodiment of the present invention as compared to the prior art.

Luminance and ambient contrast ration (ACR) are plotted for Device 1 in FIG. 7. (In the graphical Figures, the ACR scale is on the left and the luminance scale is on the right.) While the ACR of the circular polarizer is always superior in this range of ambient illumination, the applicants have also noted that, in comparison tests with observers, observers generally prefer brighter displays and, at low ambient illumination, prefer increased brightness to increased ambient contrast, for example, at an illumination of less than 80 Lux a display having increased luminance may be preferred. The actual illumination level at which a brighter device having lower ACR is preferred depends on the relative luminance (and ACR) of the compared devices. Thus, in some ambient illumination conditions, the combination of the scattering layer and the circular polarizer may provide an improved user experience compared to neutral density filters (with or without a scattering layer) or circular polarizers alone.

Figure 8:
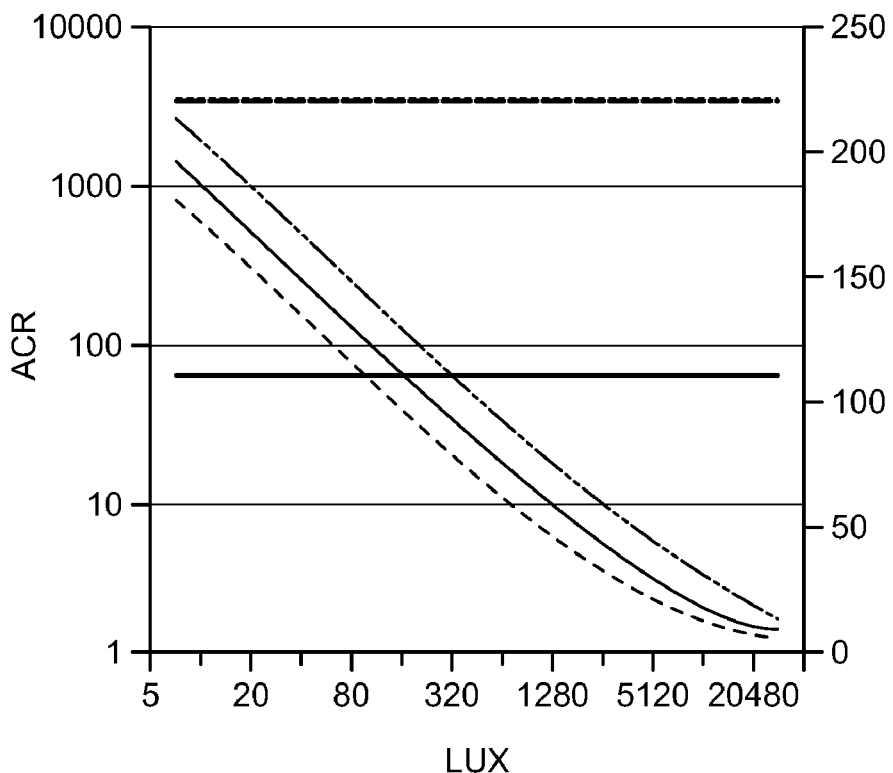
FIG. 8 is a graph illustrating the performance of an embodiment of the present invention having a reduced fill factor as compared to the prior art.
Figure 9:
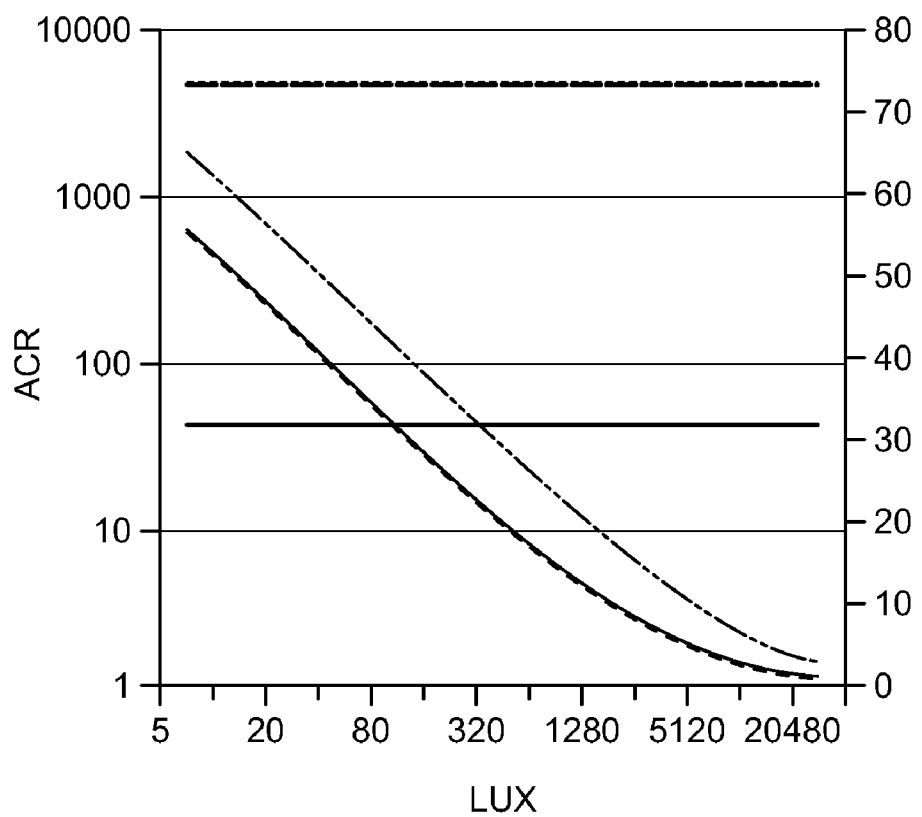
FIG. 9 is a graph illustrating the performance of an embodiment of the present invention employing an RGB configuration as compared to the prior art.

The device of Tables 1 and 2 and FIG. 7 presume that the entire area of the device is equally reflective and emitting. In practical active-matrix devices, this may not be the case. Generally, only some fraction, represented by the aperture ratio or fill factor, of the device area is light-emitting. In non-light-emitting areas of the device thin-film electronic components, planarization layers, or other highly reflective structures may be present. In such devices, the scattering layer may be employed only in the light-emitting area. For example, a bottom-emitting device having an aperture ratio of 33% may employ a scattering layer over 33% of the area (Device 2). When combined with a circular polarizer as taught in the present invention, the performance of FIG. 8 may be achieved. As can be seen from FIG. 8, the relative luminance has been maintained in this embodiment, while the ambient contrast difference has been reduced, or even improved when combined with a contrast enhancement layer In further embodiments, display devices may employ a white or broadband light emitter together with color filters to form full-color RGB displays. The color filters are also effective in absorbing ambient light, thereby decreasing the reflectivity of the display. In such a display (Device 3) having a similar fill factor and RGB filters, the performance of FIG. 9 is achieved. Note that in this embodiment, the ambient contrast performance of the displays without the contrast enhancement layer are approximately equal while the device with the contrast enhancement layer is clearly superior. At the same time, the luminance of this embodiment of the present invention is still much higher than that of the prior art.

Figure 10:
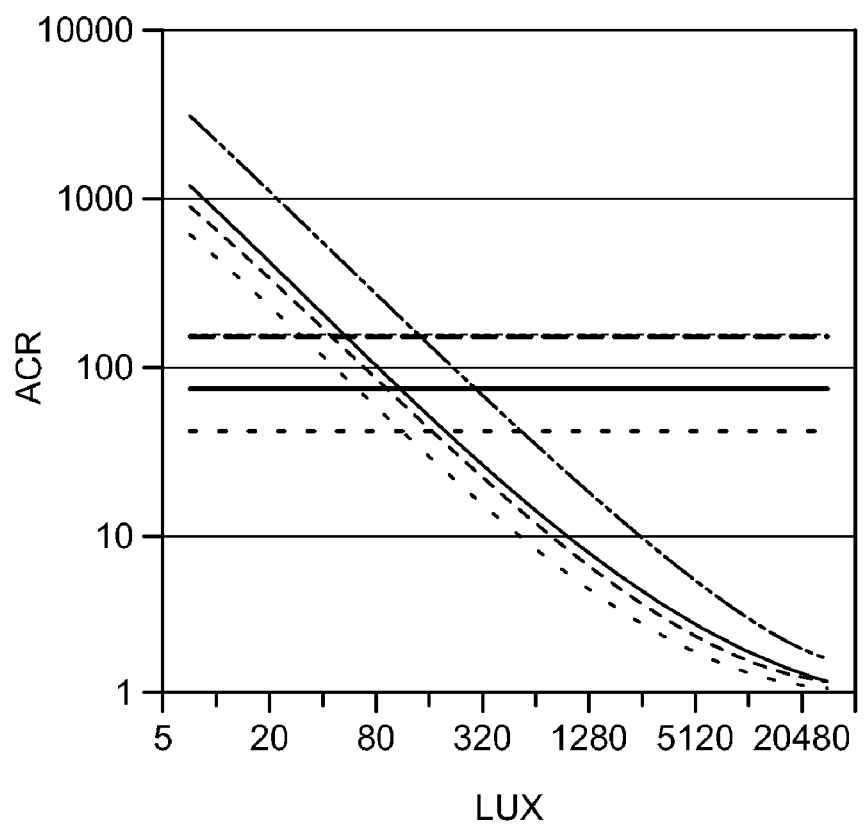
FIG. 10 is a graph illustrating the performance of an embodiment of the present invention employing an RGBW configuration as compared to the prior art.

In yet another embodiment, display devices may employ a white or broadband light emitter together with color filters and a more-efficient white emitter to form full-color RGBW displays (Device 4). The color filters are also effective in absorbing ambient light, thereby, decreasing the reflectivity of the display. The white (unfiltered) emitter has a higher efficiency than the color emitters, since no emitted light is lost to absorption in a filter. However, less ambient light may be absorbed since no color filter is present. Hence, such an embodiment may have a reflectivity somewhere between that of Device 2 and Device 3, although luminance has been improved. In such a display (Device 4) having a similar fill factor and RGBW filters, the performance of FIG. 10 is achieved. In this embodiment, the ambient contrast performances of the displays without the contrast enhancement layer are nearly equal while the device with the contrast enhancement layer is clearly superior. At the same time, the luminance of this embodiment of the present invention is still much higher than that of the prior art.

The prior art Device 3 performance is repeated on the graph for comparison.

In operation, light emitted from the light-emitting layer 14 is emitted through the scattering layer 22, the cover 20, and circular polarizer 24. Light emitted toward the back of the device is reflected from the first electrode 12, through the cover 20 and circular polarizer 26. Light trapped in the high-index layers may be scattered out of the device by light-scattering layer 22, thereby, increasing the luminance of the display. A portion of the emitted light is absorbed by the circular polarizer 24 and, if present, by the color filters 26.

Incident ambient light passes through the circular polarizer 24. If a black matrix 28 is present, light incident on the black matrix may be absorbed. Likewise, if color filters 26 are present, light incident on the color filters may be absorbed. Ambient light is reflected from reflective electrode 12 and absorbed by circular polarizer 24.

The present invention may be applied to both top- and bottom-emitter OLED displays or light-emissive displays employing inorganic emitters, such as quantum dots.

The black matrix 28 and color filters 26 may be deposited in a pattern using photolithographic techniques known in the art. For example, light-absorbing material may be coated as a liquid on the entire surface and exposed to radiation through a mask to polymerize portions of the coating. Portions of the material exposed to the radiation are cured and the remainder is washed away. Dry film photolithography may also be used. In addition, patterned thermal transfer can be used, for example, by coating material onto a donor substrate, placing the donor substrate in contact with or in close proximity to the substrate, and selectively heating the donor with a laser to cause transfer of the light absorbing material to the substrate. The black matrix 28 and color filters 26 may comprise a plurality of thinner layers deposited by sequential deposition of light absorbing materials.

In alternative embodiments, the black matrix 28 and color filters 26 may be applied to the inside of transparent cover 20 or substrate 10. If deposited on cover 20, then cover 20 with filters may be prepared separately from substrate 10. A similar masking technique as described above may be used to deposit the filters. Cover 20 is aligned with substrate 10 when the cover 20 is affixed to the substrate 10 to ensure that the light-absorbing black matrix 28 does not improperly occlude the light from the pixels.

According to a further embodiment, a black matrix 28 and color filters 26 are patterned in conjunction with one or more of the layers comprising the light-emissive layer such that the patterned layer is provided between the pixel areas. The filters may comprise all or a portion of one or more layers, i.e. they can comprise the layer, or be located within one of the layers.

A color display may be provided by an array of light emitting materials 14 that emit different colors of light. Alternatively, the color display may be provided by a white-light emitting layer together with an array of color filters to provide a color display. In this embodiment, the light absorbing material may be created through an overlap of the color filters 26, for example red and blue, to provide the black matrix 28.

While transparent cover 20 is typically glass or plastic sheet, the cover 20 can comprise materials that are deposited in a conformable manner over the surface of the materials deposited over the substrate 10. This invention is advantageously practiced with either top or bottom-emitting devices that are either operated as active-matrix or passive-matrix devices.

The invention has been described in detail with particular reference to certain preferred embodiments thereof, but it will be understood that variations and modifications can be effected within the spirit and scope of the invention.

PARTS LIST

| | |
|---|---|
| 8 | OLED device |
| 10 | substrate |
| 12 | reflective electrode |
| 13 | transparent electrode layer |
| 14 | light-emitting layer |
| 16 | transparent electrode |
| 20 | cover |
| 22 | scattering layer |
| 24 | circular polarizer |
| 25 | contrast enhancement layer |
| 25a | light absorbing portion |
| 25b | light-transmissive portion |
| 26 | color filter |
| 28 | black matrix |
| 30 | TFT circuitry |
| 32 | planarization layer |
| 50 | light-emitting area |
| 52 | light-emitting area |
| 54 | light-emitting area |
| 60 | adhesive |
| 70 | light-emitting area |
| 72 | light-emitting area |
| 74 | light-emitting area |

What is claimed is:

1. An emissive display device, comprising:
   a) a reflective electrode and a transparent electrode;
   b) one or more light-emitting layers formed between the reflective and transparent electrodes;
   c) a scattering layer separate and in a different layer from the light-emitting layer positioned in the emissive display device to scatter light trapped in the one or more light-emitting layers; and
   d) a circular polarizer located on the side of the scattering layer opposite the reflective electrode.

2. The display device claimed in claim 1, wherein the scattering layer is formed between the light-emitting layer and the circular polarizer.

3. The display device claimed in claim 1, wherein the light-emitting layer is formed between the scattering layer and the circular polarizer.

4. The display device claimed in claim 1, further comprising:
   e) a substrate, wherein the light-emitting display is a bottom-emitting display and the light is emitted through the substrate and the circular polarizer is located on the substrate.

5. The display device claimed in claim 1 further comprising:
   e) a substrate; and
   f) a cover located above the light-emitting layer and affixed to the substrate and the circular polarizer is located on the side of the cover opposite the light-emitting layer.

6. The display device claimed in claim 1 further comprising:
   e) a substrate; and
   f) a cover located above the light-emitting layer and affixed to the substrate and the circular polarizer is located between the cover and the light-emitting layer.

7. The display device claimed in claim 1, wherein the light-emitting layer emits white light and the light-emitting display further includes color filters that filter the white light.

8. The display device claimed in claim 7, wherein the color filters are formed between the circular polarizer and the light-emitting layer.

9. The display device claimed in claim 7, wherein either the reflective or transparent electrodes are patterned to form distinct light-emitting areas and further includes a black matrix formed between the distinct light-emitting areas.

10. The display device claimed in claim 1, wherein the light-emitting layer comprises organic materials.

11. The display device claimed in claim 1, wherein the light-emitting layer comprises inorganic phosphorescent or fluorescent materials.

12. The display device claimed in claim 1, wherein the reflective or transparent electrodes are patterned to form distinct light-emitting areas and the scattering layer is formed only in the distinct light-emitting areas.

13. The display device claimed in claim 1, wherein one of the electrodes is patterned to form light-emitting areas, and further comprising a contrast-enhancement layer that includes a plurality of alternating light-absorbing portions and light-transmissive portions located on the side of the scattering layer opposite the reflective electrode and located in each light-emitting area

* * * * *